United States Patent
Shih et al.

(10) Patent No.: US 8,034,690 B2
(45) Date of Patent: Oct. 11, 2011

(54) METHOD OF ETCHING OXIDE LAYER AND NITRIDE LAYER

(75) Inventors: Ping-Chia Shih, Hsinchu (TW);
Yu-Cheng Wang, Tainan (TW);
Chun-Sung Huang, Changhua (TW);
Yuan-Cheng Yang, Kaohsiung (TW);
Chung-Che Huang, Tainan (TW);
Chin-Fu Lin, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/696,055

(22) Filed: Jan. 29, 2010

(65) Prior Publication Data
US 2011/0189859 A1    Aug. 4, 2011

(51) Int. Cl.
*H01L 21/336* (2006.01)
(52) U.S. Cl. ........ 438/288; 438/128; 438/294; 438/689; 257/E21.54; 257/E21.598; 257/E21.662
(58) Field of Classification Search ............ 438/23, 438/196, 318, 359; 257/E21.532, E21.536, 257/E21.574, E21.598, E21.613, E21.662
See application file for complete search history.

(56) References Cited

U.S. PATENT DOCUMENTS

| 5,950,086 | A  | * | 9/1999 | Takahashi et al. ............ 438/258 |
| 6,500,768 | B1 |   | 12/2002 | Shields et al. |
| 6,583,066 | B2 |   | 6/2003 | Aloni et al. |

* cited by examiner

*Primary Examiner* — Cheung Lee
(74) *Attorney, Agent, or Firm* — Chun-Ming Shih (57) ABSTRACT

An exemplary method of etching an oxide layer and a nitride layer is provided. In particular, a substrate is provided. A surface of the substrate has an isolating structure projecting therefrom. A first oxide layer, a nitride layer and a second oxide layer are sequentially provided on the surface of the substrate, wherein the first oxide layer is uncovered on the isolating structure, the nitride layer is formed overlying the first oxide layer, and the second oxide layer is formed overlying the nitride layer. An isotropic etching process is performed by using an etching mask unmasking the isolating structure, and thereby removing the unmasked portion of the second oxide layer and the unmasked portion of the nitride layer and further exposing sidewalls of the isolating structure. The unmasked portion of the first oxide layer generally is partially removed due to over-etching.

9 Claims, 8 Drawing Sheets

METHOD OF ETCHING OXIDE LAYER AND NITRIDE LAYER

BACKGROUND

1. Technical Field

The present invention generally relates to a method of etching oxide layer and nitride layer and, particularly to a method of forming an oxide-nitride-oxide (ONO) structure.

2. Description of the Related Art

Usually, there are many applications of nitride and oxide within integrated circuits (ICs), for example, an isolating structure between adjacent transistors, a gate sidewall spacer, an etch stop layer, a protection layer for outermost layer of IC chip, an ONO structure, etc.

A non-volatile static random access memory (nvSRAM) is taken as an example. The nvSRAM generally includes a static random access unit and a non-volatile memory unit of two parts. The static random access unit is for temporarily accessing data when a power is supplied. The non-volatile memory unit is for storing data in the circumstance of the power being cut off and then providing the stored data to the static random access unit for use when the power is retrieved. The nvSRAM can use a silicon-oxide-nitride-oxide-silicon (SONOS) structure formed therein as a memory cell. In operation of the nvSRAM, data signals (e.g., digital signals "0" and "1") are performed with an action such as write (or termed as programming), erase or read in the SONOS structure.

However, during a conventional process for manufacturing the SONOS structure, it is found that after dry etching a top oxide layer and a nitride layer, sidewalls of a shallow trench isolation (STI) structure protruding from a wafer surface usually have unwanted residual material layer existed thereat and whereby forming a redundant fence (or termed as sidewall residual material or redundant sidewall spacer). Such redundant fence would change a surface profile of the STI structure and increase a width of the STI structure. Moreover, the redundant fence would become shielding masks of subsequent etching process and implantation process, even if adjusting the position or direction of mask for the implantation process, the influence caused by the redundant fence still could not be eliminated. As a result, dimensions of an effective area of doped region and an effective etching window are decreased. In other words, the redundant fence would cause the decrease of the effective area of active region, especially for a narrow width device. Even more, the redundant fence would cause a drop of current of the narrow width device and thus influence the operation of the narrow width device.

In order to get rid of the redundant fence, if attempting to add an additional isotropic etching process or an additional anisotropic etching process, a bottom oxide layer of the SONOS structure would suffer from twice over-etching, which would easily cause a substrate material (e.g., silicon) underneath the bottom oxide layer to be damaged, especially at the situation of the bottom oxide layer being extremely thin, electrical properties of device such as electric current are adversely affected consequently.

BRIEF SUMMARY

Accordingly, the present invention is directed to a method of etching an oxide layer and a nitride layer, to effectively remove the redundant fence on a wafer surface and avoid the damage occurring at the substrate underneath the bottom oxide layer, and thereby solve the above-mentioned issues associated with the prior art.

A method of etching an oxide layer and a nitride layer in accordance with an embodiment of the present invention is provided. The method includes steps of: (1) providing a substrate, wherein a surface of the substrate has an isolating structure; (2) providing a first oxide layer overlying the substrate, wherein the first oxide layer is unmasked on the isolating structure; (3) providing a nitride layer overlying the first oxide layer; (4) providing a second oxide layer overlying the nitride layer; and (5) performing an isotropic etching process by using an etching mask unmasking the isolating structure, and thereby removing the unmasked portion of the second oxide layer and the unmasked portion of the nitride layer and further exposing sidewalls of the isolating structure.

In one embodiment, in the isotropic etching process of the method of etching an oxide layer and a nitride layer, a part of the first oxide layer is removed e.g., by over-etching.

In one embodiment, the method of etching an oxide layer and a nitride layer further includes the step of: removing the etching mask after the isotropic etching process. In another embodiment, the method of etching an oxide layer and a nitride layer still further includes the step of: after the isotropic etching process and before removing the etching mask, removing the unmasked portion of the first oxide layer by using the etching mask.

In summary, the above-mentioned embodiments of the present invention use a single etching process (e.g., the isotropic etching process) to pattern the second oxide layer and the nitride layer, nitride located at sidewalls of the isolating structure on the substrate also is removed at the same time and the first oxide layer only suffer from one time over-etching. Compared with the prior art, for the substrate underneath the first oxide layer, even if the first oxide layer is extremely thin, it still does not encounter damage during the isotropic etching process for patterning the second oxide layer and the nitride layer, the ultimately manufactured device would achieve better performance as a result.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
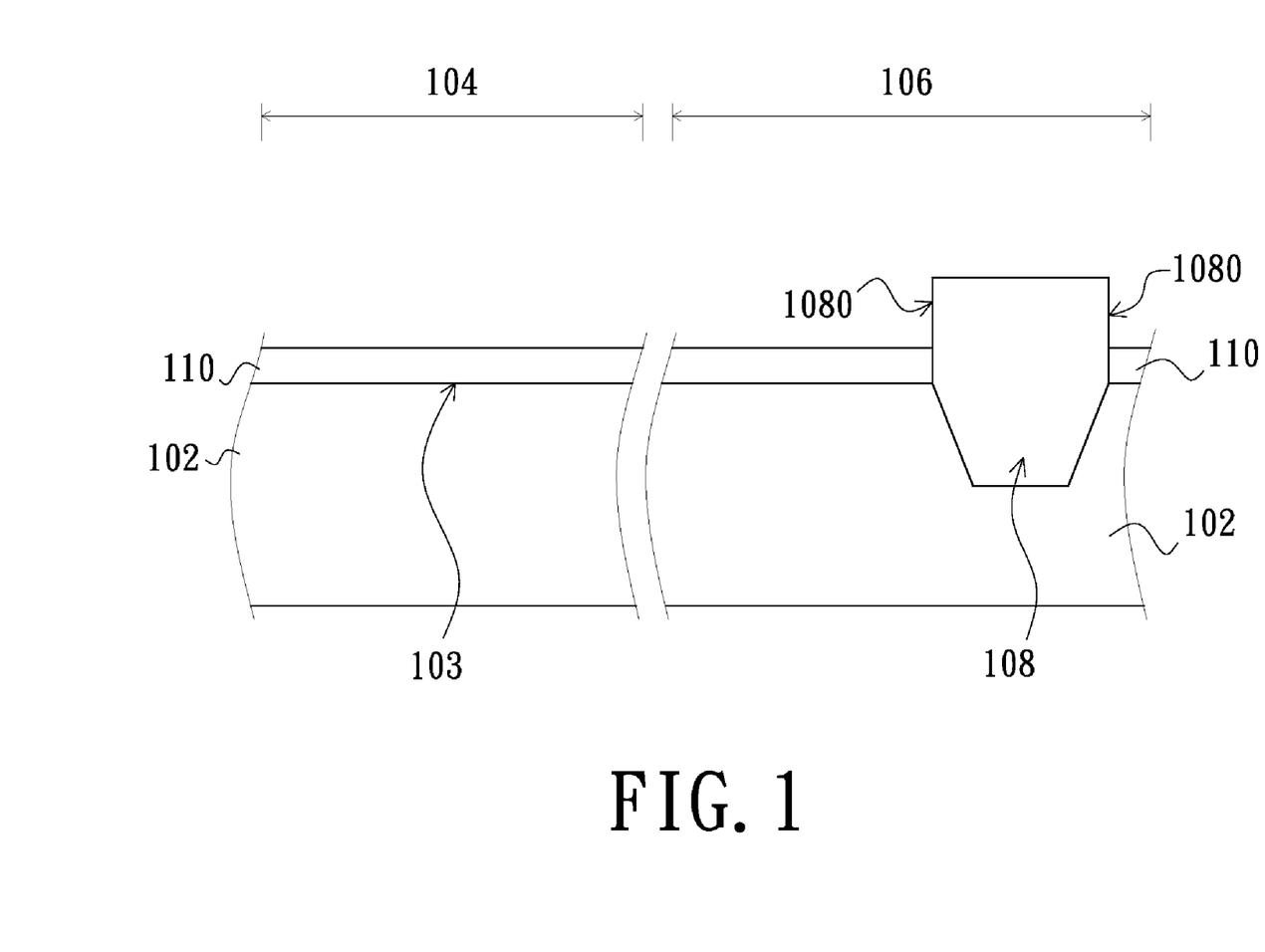
FIG. 1 shows a step of providing a bottom oxide layer overlying a substrate, associated with a method of etching an oxide layer and a nitride layer, in accordance with an embodiment of the present invention.
Figure 5:
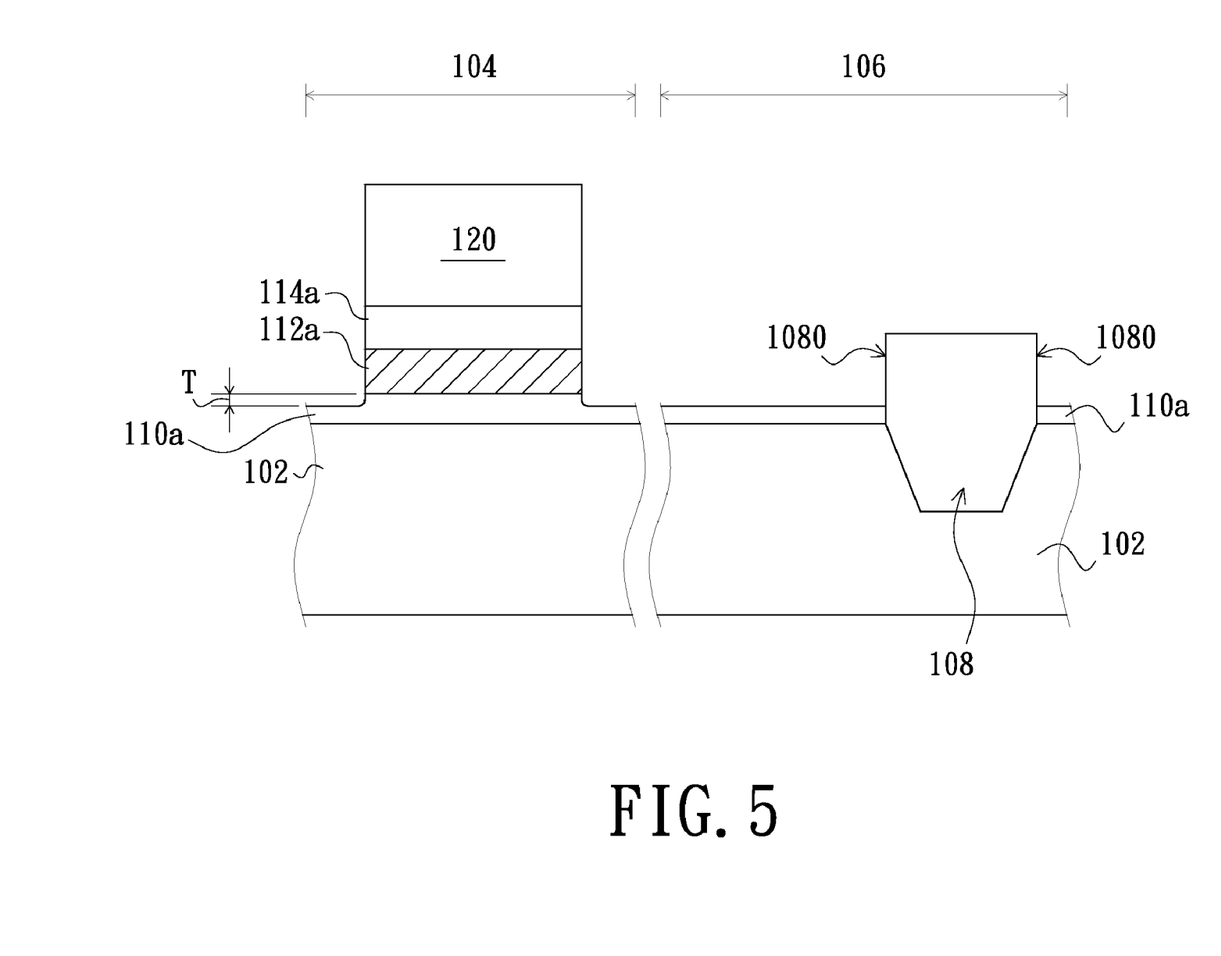
FIG. 5 shows a step of performing an isotropic etching process by using the patterned photoresist of FIG. 4 as an etching mask.

Referring to FIGS. 1 and 5, showing schematic views associated with a method of etching an oxide layer and a nitride layer in accordance with an embodiment of the present invention. In the drawings, same or like components or parts are designated by the same reference numerals, the drawings only are for illustrative purpose, they are not drawn according to actual scale. Moreover, the method of etching an oxide layer and a nitride layer in accordance with the present embodiment is adapted for the fabrication of a semiconductor device including, but is not limited to, a central processing unit (CPU), a non-volatile memory device or a digital signal processor (DSP).

As illustrated in FIG. 1, a substrate 102 for example a silicon substrate, a silicon-containing substrate or a silicon-on-insulator (SOI) substrate, etc. is firstly provided. The substrate 102 has at least one active region 104 and at least one isolating region 106 defined thereon. The active region 104 is used for the formation of various active devices for example, an ONO structure associated with the illustrated embodiment, an SONOS transistor or other logic device. The isolating region 106 can have an isolation structure 108 for example a shallow trench isolation (STI) structure or a field oxide layer formed therein by a STI process or a local oxidation (LOCOS) process. The isolation structure 108 is for surrounding and isolating the active devices in the active region 104.

In the process of manufacturing the devices, a top surface 103 of the substrate 102 would appear an undulated profile along with various layout patterns and thus is not a planar surface. For example, in the illustrated embodiment, the isolation structure 108 is an isolating structure of the top surface 103 of the substrate 102 and steps high from the top surface 103 of the substrate 102. A height of the isolation structure 108 is higher than the substrate 102 located two sides thereof about 300 angstroms.

Furthermore, the substrate 102 has a bottom oxide layer 110 provided to be overlying thereon. In particular, the bottom oxide layer 110 is formed on the top surface 103 of the substrate 102 and thus covers the substrate 102 but does not cover the isolation structure 108. A method for the formation of the bottom oxide layer 110 is for example a thermal oxidation, a low-pressure chemical vapor deposition (LPCVD) or a plasma enhanced chemical vapor deposition (PECVD). Advantageously, the bottom oxide layer 110 formed by the thermal oxidation process would have favorable anti-corrosion effect, but is not limited to this example.

Figure 2:
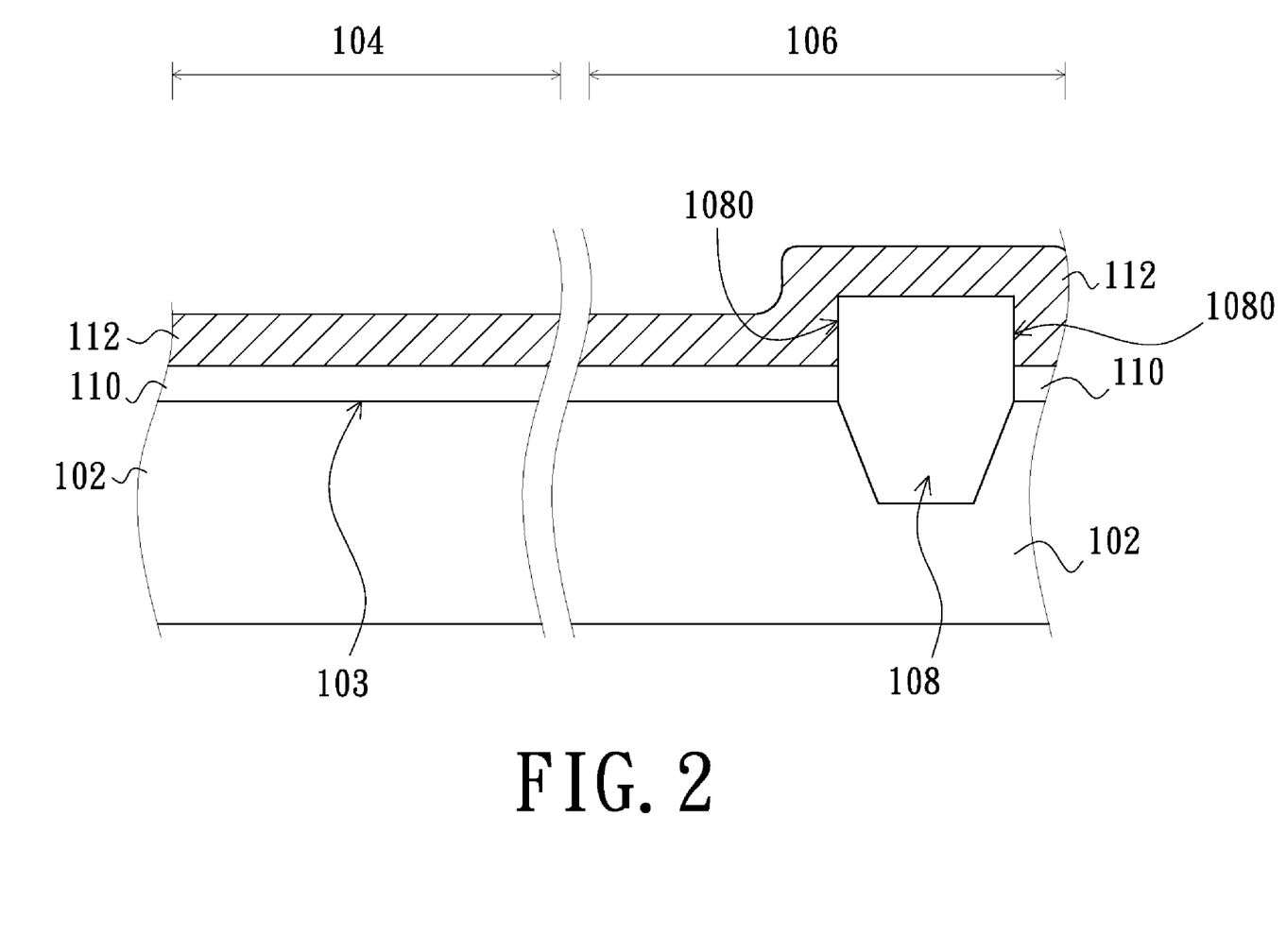
FIG. 2 shows a step of providing a nitride layer overlying the bottom oxide layer of FIG. 1.

Subsequently, as illustrated in FIG. 2, a nitride layer 112 is provided to be overlying the bottom oxide layer 110. More specifically, the nitride layer 112 is formed on the bottom oxide layer 110 and further covers the bottom oxide layer 110 and a top surface and sidewalls 1080 of the isolation structure 108. A method for the formation of the nitride layer 112 is for example a LPCVD or PECVD process.

Figure 3:
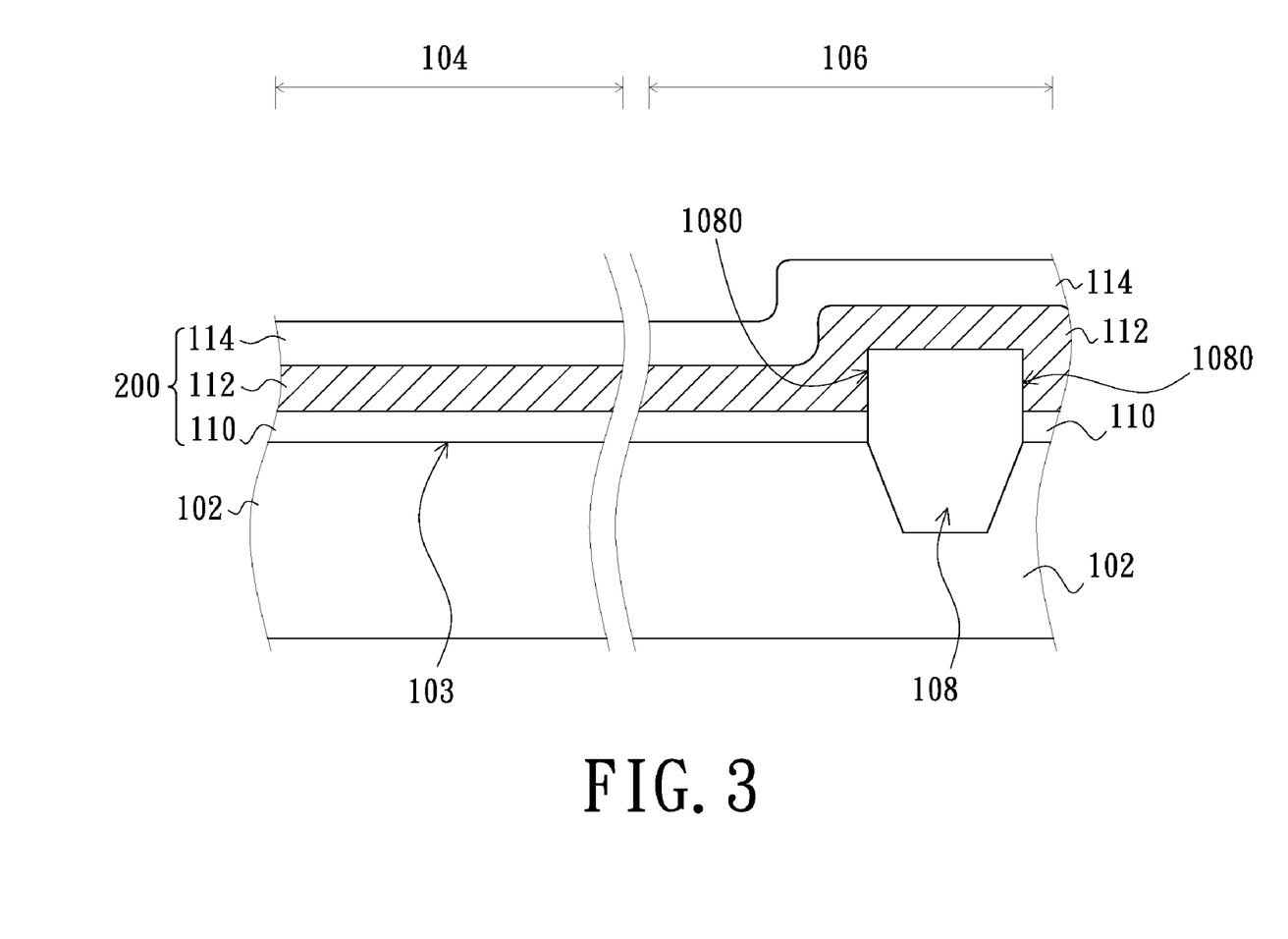
FIG. 3 shows a step of providing a top oxide layer overlying the nitride layer of FIG. 2 and thereby forming an oxide-nitride-oxide stacked layer.

Then, as illustrated in FIG. 3, a top oxide layer 114 is provided to be overlying the nitride layer 112. In particular, the top oxide layer 114 covers the nitride layer 112 and a method for the formation of the top oxide layer 114 is for example LPCVD or PECVD. Herein, the top oxide layer 114, the nitride layer 112 and the bottom oxide layer 110 cooperatively constitute an oxide-nitride-oxide (ONO) stacked layer 200.

Figure 4:
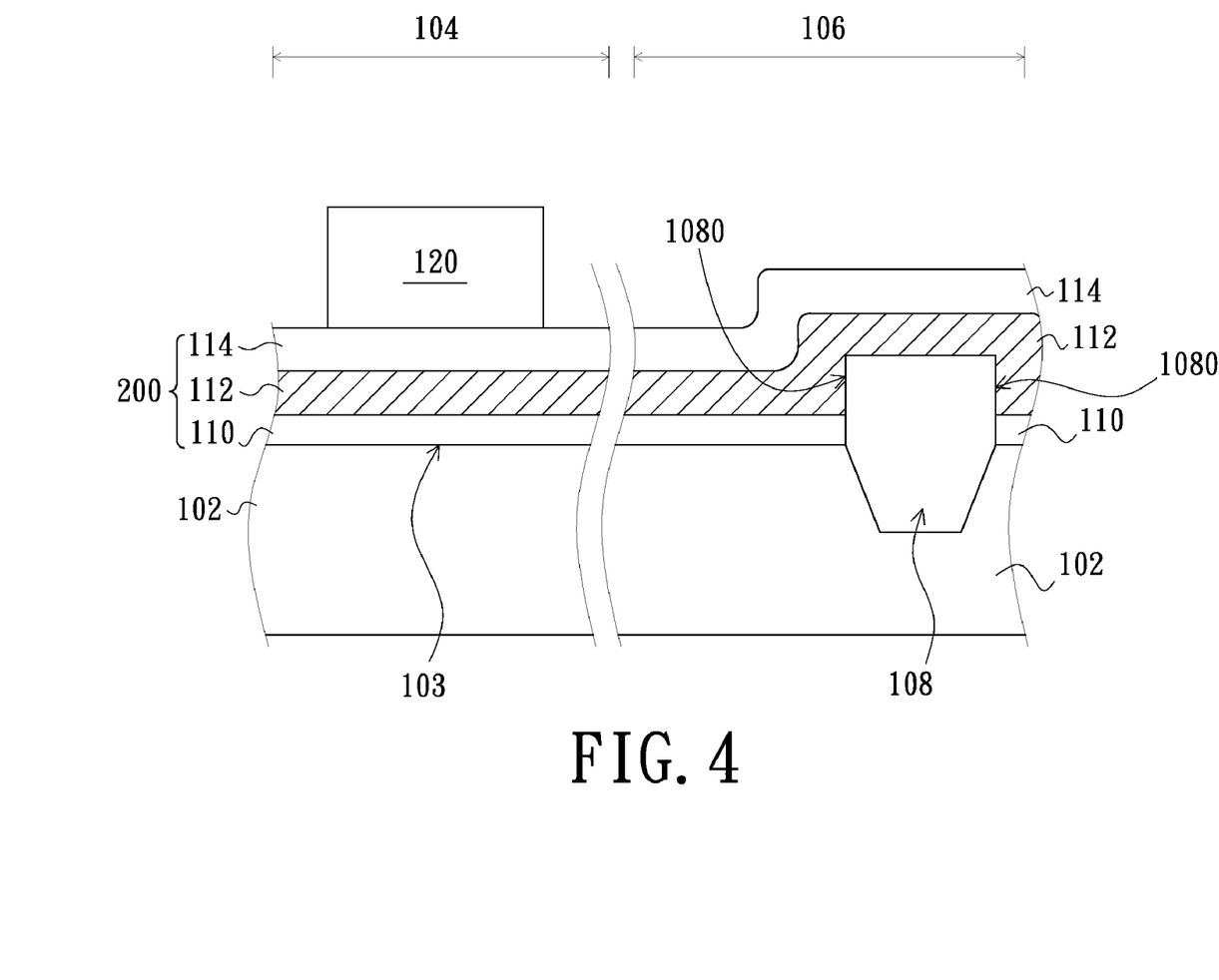
FIG. 4 shows a step of providing a patterned photoresist on the oxide-nitride-oxide stacked layer of FIG. 3.

Afterwards, as illustrated in FIG. 4, a masking layer is formed on the top oxide layer 114 of the ONO stacked layer 200. Herein, the masking layer is for example a patterned photoresist 120, but not to limit the present invention. Moreover, the patterned photoresist 120 is unmasked on the isolation structure 108 of the substrate 102. More specifically, the patterned photoresist 120 is formed for example by a coating and photolithography process. The patterned photoresist 120 herein can be disposed in the active region 104 and for defining the position of subsequently formed ONO structure. In addition, the patterned photoresist 120 advantageously can include a deep ultraviolet (DUV) photoresist material, but is not limited to this example. Compared with other photoresist material, the use of DUV photoresist material can decrease a critical dimension of layout pattern and provide better device accuracy. In other embodiment, the oxide-nitride-oxide stacked layer 200 and the patterned photoresist 120 have an additional hard mask formed therebetween, but is not limited to this example.

As illustrated in FIG. 5, an isotropic etching process is performed on both the top oxide layer 114 and the nitride layer 112 by using the patterned photoresist 120 as an etching mask. As seen from FIG. 5, the exposed portion (i.e., the portion unmasked by the patterned photoresist 120) of the top oxide layer 114 and the exposed/unmasked portion of the nitride layer 112 are etched off until exposing the bottom oxide layer 110, a patterned top oxide layer 114a and a patterned nitride layer 112a both are formed as a result, the etched-off portion of the nitride layer 112 includes the nitride located at the top surface and the sidewalls 1080 of the isolation structure 108. Moreover, the exposed/unmasked portion of the bottom oxide layer 110 is partially removed due to over-etching and thereby an over-etched bottom oxide layer 110a is formed. A thickness T of the etched-off portion of the bottom oxide layer 110 is smaller than the total thickness of the bottom oxide layer 110.

The isotropic etching process will be described below in detail by taking a dry etching process as an example. It is noted that, the isotropic etching process in accordance with the embodiment of the present invention is not limited to be a dry etching process, and may be a wet etching process instead.

In the illustrated embodiment, the dry etching process can be a radio frequency (RF) plasma etching process and performs an isotropic etching on both the top oxide layer 114 and the nitride layer 112 in an in-situ manner. In particular, the RF plasma etching process can be performed in a well-known RF plasma etching chamber, the process parameters such as etching temperature, etching gas, RF power and so on are well-known by the skill person in the art and thus will not be repeated herein. A major factor in the RF plasma etching process is that: during etching the nitride layer 112, a DC bias voltage applied to an electrode for placing the substrate 102 with the ONO stacked layer 200 is set to be zero or approximately zero, so that the DC bias voltage that the substrate 102 with the ONO stacked layer 200 experiences approaches zero, and thus low energy plasma in the chamber comes into contact with the ONO stacked layer 200 at a relatively low rate of speed. As a result, the purpose of isotropic etching is readily achieved. Furthermore, in order to reserve some of the initially formed bottom oxide layer 110 for protecting the surface of the active region 104 from damage due to over-etching, an etching gas having a better nitride to oxide selectivity is expected for use. The etching gas can be a gas mixture including nitrogen trifluoride ($NF_3$) and Helium (He).

Figure 6:
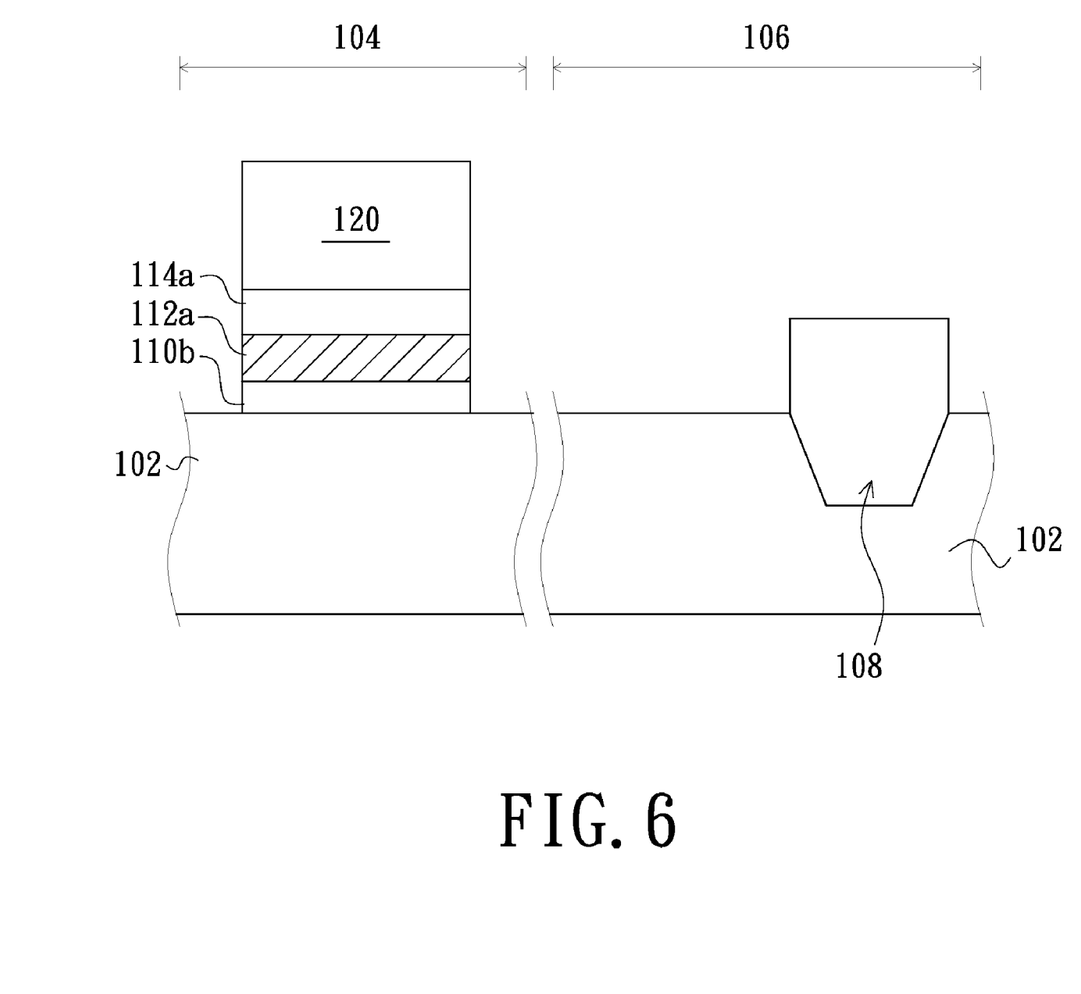
FIG. 6 shows a step of etch removing the unmasked portion of the over-etched bottom oxide layer by using the patterned photoresist of FIG. 5 as an etching mask.

Referring to FIG. 6, after the patterned top oxide layer 114a and the patterned nitride layer 112a are formed, the exposed/unmasked portion of the over-etched bottom oxide layer 110a is removed by using the patterned photoresist 120 as an etching mask, and thereby forming a patterned bottom oxide layer 110b. The etching process herein can be performed by use of a buffered oxide etchant. For example, the buffered oxide etchant can contain a hydrofluoric acid solution and an ammonium fluoride solution so as to provide better etching selectivity, but is not limited to the present invention.

Figure 7:
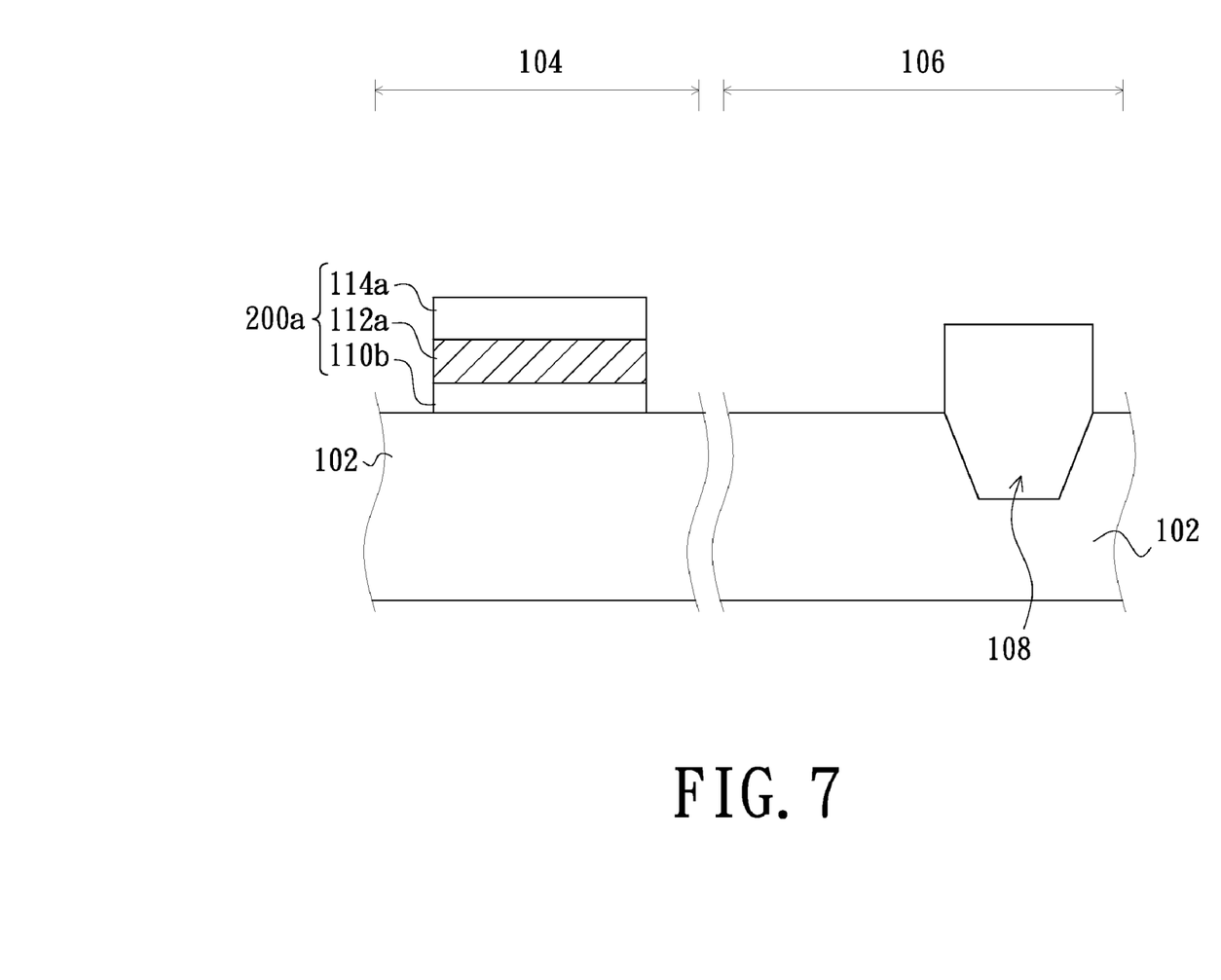
FIG. 7 shows a step of removing the patterned photoresist of FIG. 6 and thereby forming an oxide-nitride-oxide (ONO) structure.

Referring to FIG. 7, the patterned photoresist 120 is removed and an ONO structure 200a below the patterned photoresist 120 is remained. The ONO structure 200a herein is formed on the substrate 102 and includes the patterned top oxide layer 114a, the patterned nitride layer 112a and the patterned bottom oxide layer 110b. For the removal of the patterned photoresist 120, a photoresist lift-off process can be performed to achieve the purpose. For example, the patterned photoresist 120 can be removed by performing an ashing process.

Figure 8:
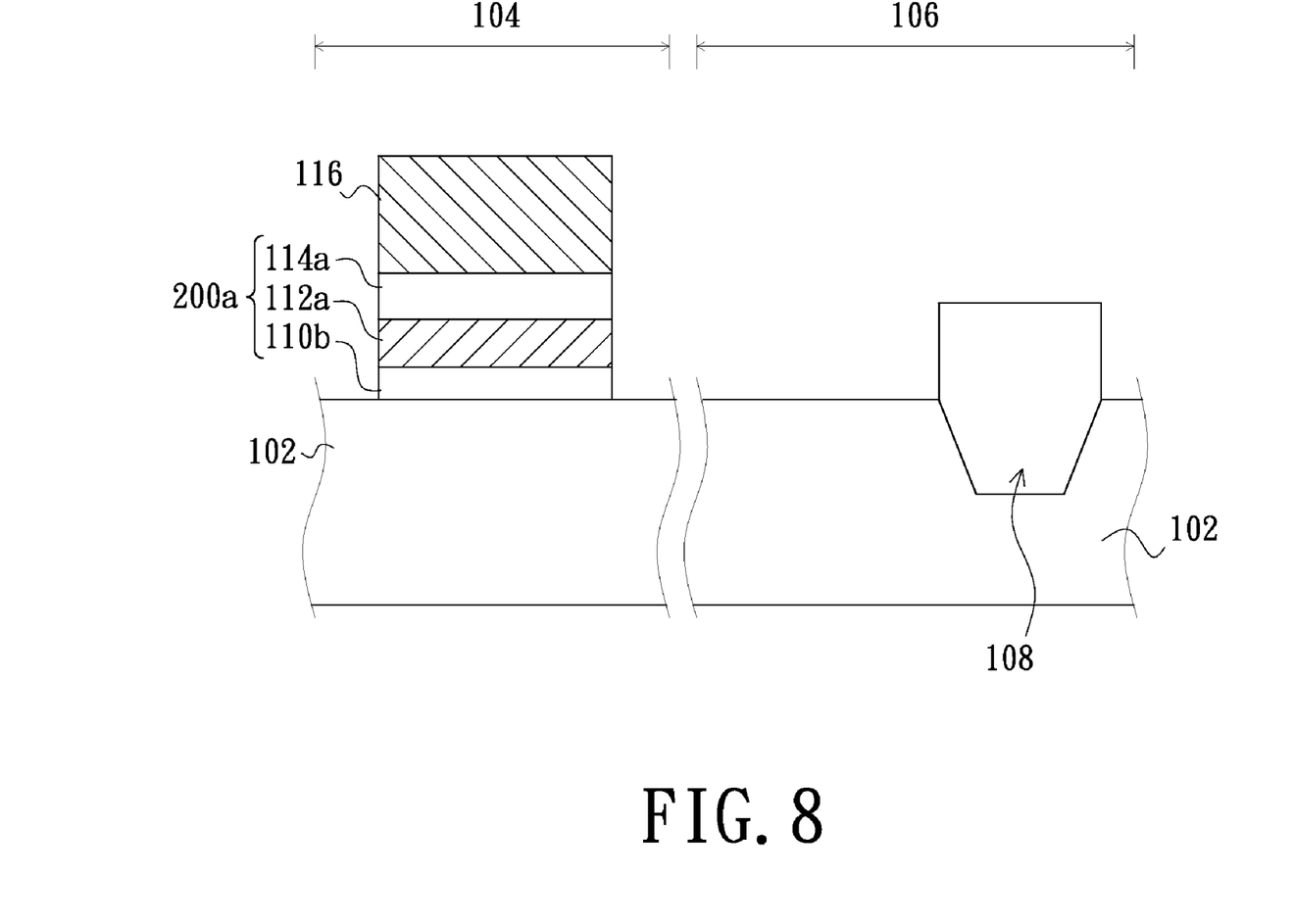
FIG. 8 shows a step of forming a poly-silicon layer overlying the ONO structure of FIG. 7.

Referring to FIG. 8, in other embodiment, after removing the patterned photoresist 120, a poly-silicon layer 116 can be further formed overlying the patterned top oxide layer 114a of the ONO structure 200a and thereby a SONOS structure is obtained.

In summary, the above-mentioned embodiments of the present invention use a single etching process (e.g., the isotropic etching process) to pattern the top oxide layer and the nitride layer in the ONO stacked layer, nitride located at sidewalls of the isolating structure on the substrate also is removed at the same time and the bottom oxide layer only suffer from one time over-etching. Compared with the prior art, for the substrate underneath the bottom oxide layer, even if the bottom oxide layer is extremely thin, it still does not encounter damage during the etching process applied to the top oxide layer and the nitride layer, the ultimately manufactured device would achieve better performances as a result.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of etching an oxide layer and a nitride layer, comprising:
   providing a substrate, wherein the substrate has an isolating structure;
   providing a first oxide layer overlying the substrate while exposing the entire isolating structure;
   providing a nitride layer overlying the first oxide layer as well as the isolating structure;
   providing a second oxide layer overlying the nitride layer; and
   performing an isotropic etching process by using an etching mask unmasking the isolating structure, and thereby removing an unmasked portion of the second oxide layer and an unmasked portion of the nitride layer, and further exposing sidewalls of the isolating structure.

2. The method as claimed in claim 1, wherein the isotropic etching process further removes a part of the first oxide layer.

3. The method as claimed in claim 1, further comprising: after the isotropic etching process, removing an unmasked portion of the first oxide layer by using the etching mask.

4. The method as claimed in claim 3, further comprising: after removing the unmasked portion of the first oxide layer, removing the etching mask.

5. The method as claimed in claim 4, further comprising: after removing the etching mask, forming a poly-silicon layer overlying the etched second oxide layer.

6. The method as claimed in claim 1, wherein the etching mask is a patterned photoresist.

7. The method as claimed in claim 1, wherein the substrate has an active region and an isolating region defined thereon, the isolating structure is disposed in the isolating region, and the etching mask is disposed in the active region.

8. The method as claimed in claim 1, wherein the isotropic etching process is a dry etching process.

9. The method as claimed in claim 1, wherein the isotropic etching process is a wet etching process.

* * * * *